United States Patent
Sakata et al.

(10) Patent No.: US 7,772,756 B2
(45) Date of Patent: Aug. 10, 2010

(54) LIGHT-EMITTING DEVICE INCLUDING A DUAL EMISSION PANEL

(75) Inventors: Junichiro Sakata, Kanagawa (JP); Takahiro Ibe, Kanagawa (JP); Hisao Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1023 days.

(21) Appl. No.: 10/898,735

(22) Filed: Jul. 26, 2004

(65) Prior Publication Data

US 2005/0024293 A1 Feb. 3, 2005

(30) Foreign Application Priority Data

Aug. 1, 2003 (JP) ............................. 2003-285390

(51) Int. Cl.
*H01J 1/62* (2006.01)
*H01J 63/04* (2006.01)

(52) U.S. Cl. .................... 313/498; 313/504; 313/506; 313/512

(58) Field of Classification Search .............. 313/498, 313/501–504, 506, 512; 257/98–100
See application file for complete search history.

(56) References Cited

U.S. PATENT DOCUMENTS

| 5,061,569 | A |   | 10/1991 | VanSlyke et al. |
|---|---|---|---|---|
| 5,233,444 | A | * | 8/1993 | Musha et al. ................. 359/15 |
| 5,396,430 | A |   | 3/1995 | Arakawa et al. ............ 701/200 |
| 5,800,265 | A |   | 9/1998 | Yamazaki et al. ............. 463/23 |
| 5,813,743 | A | * | 9/1998 | Naka ............................ 362/16 |
| 6,025,894 | A | * | 2/2000 | Shirasaki et al. .............. 349/69 |
| 6,414,431 | B1 | * | 7/2002 | Yu et al. ...................... 313/504 |
| 6,483,484 | B1 |   | 11/2002 | Yamazaki et al. .............. 348/8 |
| 6,498,049 | B1 |   | 12/2002 | Friend et al. |
| 6,637,896 | B2 | * | 10/2003 | Li et al. ...................... 353/119 |
| 6,873,099 | B2 | * | 3/2005 | Maeda ....................... 313/504 |
| 2001/0020922 | A1 |   | 9/2001 | Yamazaki et al. ............. 345/45 |
| 2001/0055082 | A1 | * | 12/2001 | Kubo et al. ................. 349/114 |

(Continued)

FOREIGN PATENT DOCUMENTS

CN 1233929 11/1999

(Continued)

OTHER PUBLICATIONS

H. H. Lee, "9.3: 2.2" QCIF Full Color Transparent AMOLED Display, SID'03 Digest, 2003 International Symposium Digest of Technical Papers, vol. XXXIV, Book 1, pp. 104-107.

(Continued)

*Primary Examiner*—Karabi Guharay
*Assistant Examiner*—Kevin Quarterman
(74) *Attorney, Agent, or Firm*—Fish & Richardson P.C.

(57) ABSTRACT

There is a problem in a dual emission device emitting light out of both surfaces that an image on the surface and an image on the rear surface are different from each other (either image is mirror-reversed). A dual emission device is disclosed in which either light emitted from the light-emitting device is reflected by glass including a semi-transmissive film to display on glass an image same as another image obtained also from the light-emitting device, and simultaneously, external information can be viewed through the glass. A mirror can be arranged between the dual emission device and the glass including a semitransparent film.

13 Claims, 7 Drawing Sheets

U.S. PATENT DOCUMENTS

| | | | |
|---|---|---|---|
| 2003/0102801 A1* | 6/2003 | Senbonmatsu | 313/506 |
| 2003/0218070 A1* | 11/2003 | Tsikos et al. | 235/472.01 |
| 2004/0201545 A1 | 10/2004 | Yamazaki et al. | 345/1.1 |
| 2004/0227159 A1 | 11/2004 | Nakashima et al. | 257/202 |
| 2004/0227698 A1 | 11/2004 | Yamazaki et al. | |
| 2004/0245529 A1 | 12/2004 | Yamazaki et al. | 257/79 |
| 2004/0245531 A1 | 12/2004 | Fuii et al. | 257/88 |
| 2005/0052348 A1 | 3/2005 | Yamazaki et al. | 345/44 |

FOREIGN PATENT DOCUMENTS

| | | |
|---|---|---|
| JP | 05-085446 | 4/1993 |
| JP | 05-234681 | 9/1993 |
| JP | 06-088731 | 3/1994 |
| JP | 06-182056 | 7/1994 |
| JP | 06-215300 | 8/1994 |
| JP | 10-201727 | 8/1998 |
| JP | 2001-272968 | 10/2001 |
| JP | 3408154 | 5/2003 |
| WO | WO 99/43031 | 8/1999 |

OTHER PUBLICATIONS

Exhibition of Active Matrix Type Organic EL Display at "13th Flat Panel Display Manufacturing Technology Expo & Conference" by ELDis Group (*in Japanese with full translation*); Jul. 2, 2003.

Documents distributed in the "13th Flat Panel Display Manufacturing Technology Expo & Conference" by ELDis Group (5 pages); Jul. 2, 2003.

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

Hirokazu Takada et al.; "Aligning Layers Using Azo Dye Derivatives for Liquid Crystal Devices"; *SID 03 Digest*; pp. 620-623; 2003.

Office Action (Application No. 200410055950.0; CN7290) dated Aug. 15, 2008 with English translation (14 total pages).

* cited by examiner

LIGHT-EMITTING DEVICE INCLUDING A DUAL EMISSION PANEL

BACKGROUND OF THE INVENTION

1. Field of the Invention

This invention relates to a display device including a dual emission panel that emits light from the both surfaces of a substrate.

2. Related Art

In recent years, research on a light-emitting device including an electroluminescent element (hereinafter, EL element) manufactured as a self-luminous type light-emitting device has been intensified. The light-emitting device is also referred to as an organic EL display, or an organic light-emitting diode. Such light-emitting device has been attracted attention as a next generation display device such as a new generation cellular phone or a portable digital assistant for their characteristics of high reaction speed, low driving voltage, low power consumption, and the like.

An EL element including a layer containing an organic compound (hereinafter, EL layer) as a light-emitting layer has the structure in which the EL layer is interposed between an anode and a cathode. Upon applying current through the EL layer, holes and electrons are recombined to produce excitons in the EL layer (specifically, a light-emitting layer in the EL layer), and the excitons radiate energy while returning to the ground state. The energy is released by emitting light. Fluorescence that occurs from the singlet excited state back down to the ground state and phosphorescence that occurs from the triplet excited state back down to the ground state are obtainable from the EL element.

The foregoing EL layer is composed of single compound layer or a plurality of compound layers. For example, a hole injecting layer, a hole transporting layer, a light-emitting layer, an electron injecting layer, and an electron transporting layer are appropriately stacked to form the EL layer. Materials for forming the EL layer can be broadly divided into two categories, low molecular materials (monomer materials) and high molecular materials (polymer materials). The low molecular materials are formed into a film generally by a vapor deposition device.

Light from the EL layer is emitted out of a transparent anode or a transparent cathode. Hence, the EL layer can be used as a part of a light-emitting device. In general, ITO that is a transparent electrode is used for an anode in order to emit light out of the side of the anode. (For example, see Unexamined Patent Publication No. 5-234681.) However, a light-emitting device emitting light out of both an anode and a cathode, each of which is formed by a transparent film, has been developed and attracted attention in recent years. (For example, see SID 03 DIGEST pp. 104-107).

There is a problem in a light-emitting device emitting light out of both surfaces that an image on the surface and an image on the rear surface are different from each other (either image is mirror-reversed), and so erect images cannot be simultaneously seen on both surfaces.

SUMMARY OF THE INVENTION

In the view of the foregoing, it is an object of the present invention to provide a light-emitting device by which an erect image and an external image can be seen simultaneously, and a light-emitting device by which erect images can be simultaneously seen on both surfaces of the light-emitting device.

One aspect of the invention disclosed in the specification is a display device in which an image produced by light emitted from at least one surface of the light-emitting device including the foregoing light-emitting element is entered into a reflective and transmissive film (semi-transmissive film).

Either image on one surface of the light-emitting device emitting light out of both surfaces is an erect image and another image on another surface is a symmetrical reverse image. By reflecting and reversing light emitted from one surface, the identical images can be obtained from the both surfaces.

According to a display device by the invention, both images can be seen by converting a reverse image displayed on one surface of the light-emitting device into an erect image by an optical system.

These and other objects, features and advantages of the present invention will become more apparent upon reading of the following detailed description along with the accompanied drawings.

DESCRIPTION OF THE INVENTION

Hereinafter, an embodiment of the present invention is explained.

Figure 1:
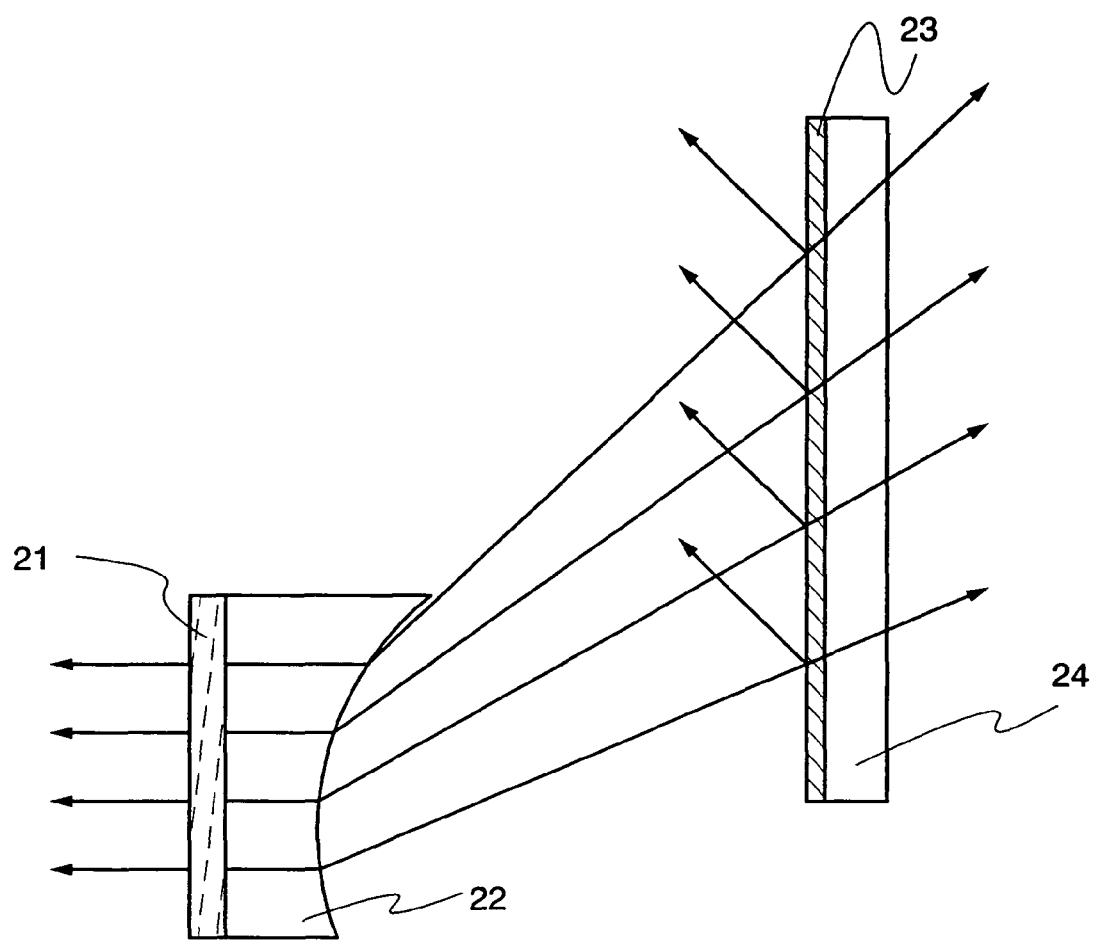
FIG. 1 is a view for showing Embodiment according to the present invention.

FIG. 1 shows an example of a display device according to the present invention. The display device comprises a light-emitting device 21, an optical device 22, a semi-transmissive film 23, and a support 24.

The light-emitting device 21 is a dual emission device emitting light out of both surfaces. Accordingly, images can be obtained from both surfaces of the light-emitting device 21. An erect image can be obtained from one surface (left side in FIG. 1) of the light-emitting device 21. A reverse image, which is obtained by mirror-reversing the erect image, can be obtained from another surface (right side in FIG. 1) of the light-emitting device 21. Further, it is possible that the light-emitting device 21 can be a non-transmissive dual emission display device by pasting polarizing plate onto the both surfaces of the light-emitting device 21.

A reverse image displayed by the light-emitting device 21 is captured by the optical device 22. In addition, the optical device 22 can vary the size of the image or correct color in the image by adjusting an optical path or an optical path length. The reverse image captured by the optical device 22 is entered into the support 24, which is transparent. A semi-transmissive film 23 is provided over the surface of the support 24. Consequently, the reverse image reflected by the semi-transmissive film 23 is mirror-reversed again to be displayed as an erect image. Further, as the support 24, which is transparent, glass, quartz, plastic, or the like can be used. According to the structure, a composite image of both of an external image visible through the support 24 and an erect image obtained by reversing again the reverse image can be seen.

The semi-transmissive film 23 is used in Embodiment. Alternatively, a reflecting film (mirror), which does not transmit light, can be used. In this case, the support 24 is not necessarily transparent.

In case that an erect image and a reverse image are respectively displayed by both surfaces of a light-emitting device, the both images can be displayed as erect images by using the foregoing display device according to the invention.

Hereinafter, the invention will be explained by using examples in detail.

Example 1

In Example 1, a specific example of a display device explained in Embodiment is explained with reference to FIGS. 2 to 4C.

Figure 2:
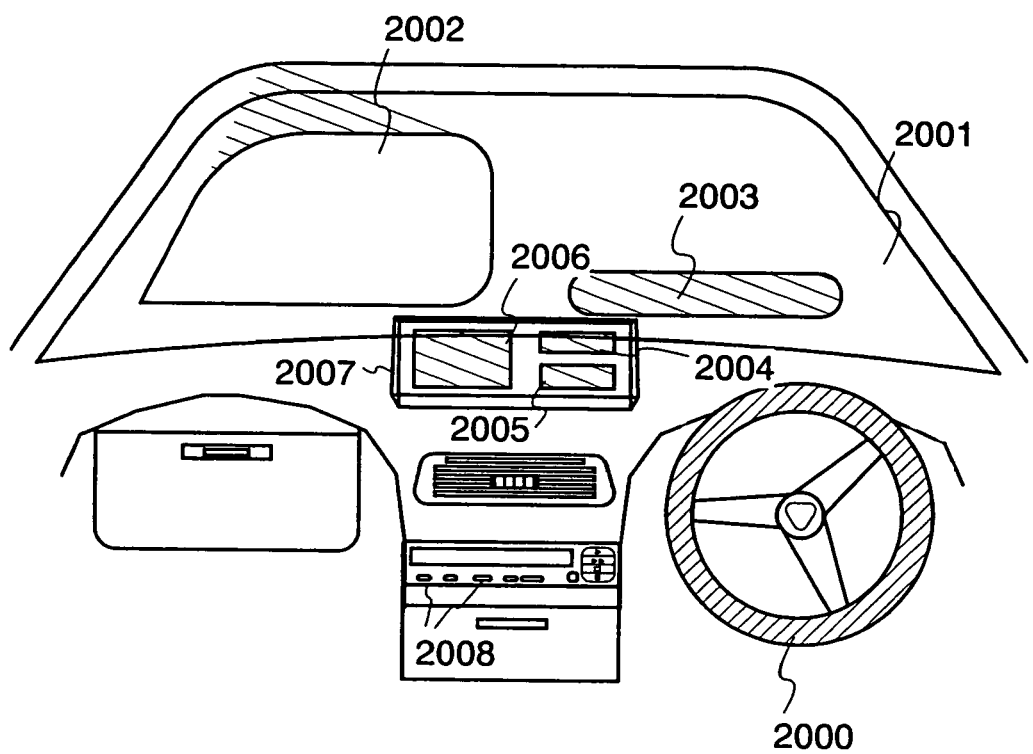
FIG. 2 is a view for showing Example 1 according to the invention.

FIG. 2 shows an example in which a front glass is used in a vehicle as a display device. FIG. 2 is an internal view of a vehicle. Reference numeral 2000 denotes a handle; 2001, a front glass; 2007, an interior; and 2008, operation buttons. A display device according to the invention is provided to the interior 2007. Images are displayed on screens of a display portion A 2002, a display portion B 2003, a display portion C 2004, a display portion D 2005, and a display portion E 2006. Further, the front glass 2001 corresponds to the support 24 described in Embodiment.

A light-emitting device included in the interior 2007 is a dual emission device. The dual emission device and the front glass 2001 compose the structure explained in Embodiment. A light-emitting device is capable of dual emission. Light emitted from the opposite side of a driver is displayed on at least either the display portion A 2002 or the display portion B 2003 of the front glass 2001. A portion displaying an image in the front glass 2001 is provided with a semi-transmissive film in order to view the outside of the vehicle through the front glass 2001. Simultaneously, the same display image as that displayed on the interior 2007 can be viewed on the front glass 2001. By the display device according to the invention, images can be displayed on the display portion C 2004, the display portion D 2005, and the display portion E 2006, and simultaneously, images can be displayed on at least either the display portion A 2002 or the display portion B 2003 of the front glass 2001 to give the information similarly to that obtained from the display portions D, E and F to a driver and people in the vehicle.

As contents displayed on the display portions A 2002 to E 2006 of the interior and the front glass 2001, images of vehicle navigation for driving directions for a driver, and information of speed meter or clock can be displayed. A user operates the display screen by the operation buttons 2008.

Figure 3A:
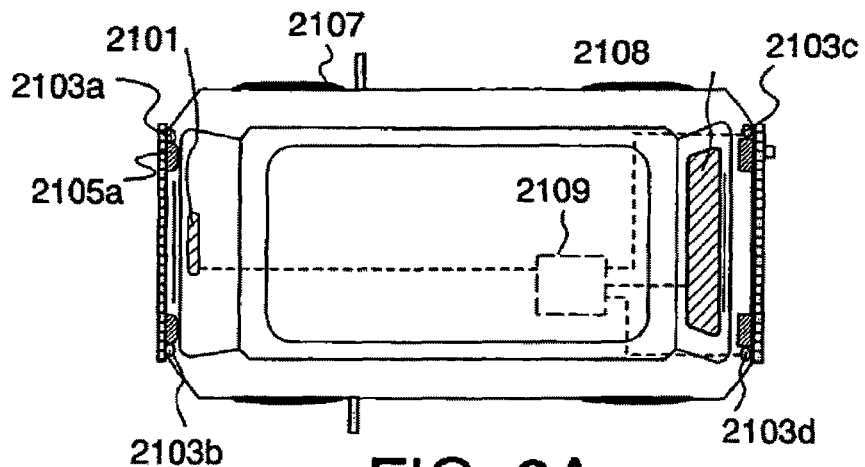
FIGS. 3A to 3C are views for showing Example 1 according to the invention.
Figure 3B:
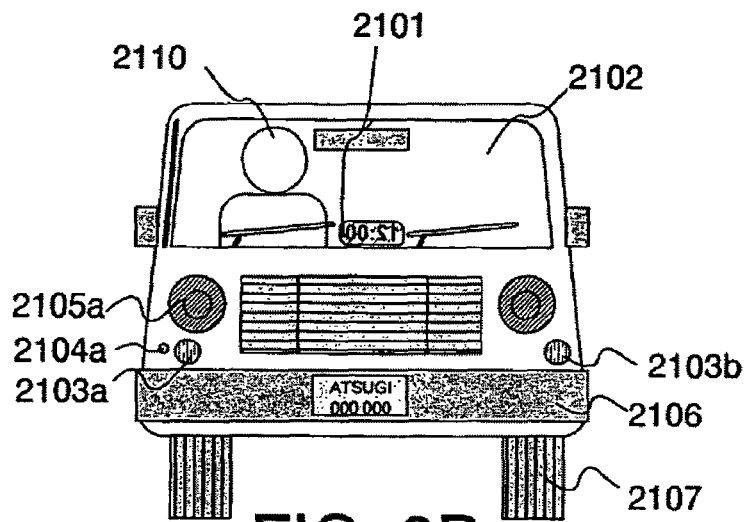
Figure 3C:

FIG. 3A is a top view of a vehicle, FIG. 3B is a side view of a front face of the vehicle, and FIG. 3C is a side view of a rear face of the vehicle. In FIGS. 3A to 3C, reference numeral 2102 denotes a front glass; 2103a to 2103d, cameras; 2104a and 2104b, sensors; 2105a and 2105b, lights; 2106, a bumper; 2107, a wheel; 2109, a CPU; 2110, a driver; and 2111, a rear window glass. Though not shown, the vehicle has an energy source such as electricity or gasoline, a motor for supplying power such as engine, a power transmission device, a brake system, a steering device, a suspension device, an electrical system, accessories, and the like. Further, the number of and the installation site of the camera, the sensor, microphones, and the like are not restrictive as shown in FIGS. 3A to 3C, and can be determined randomly.

In FIGS. 3A to 3C, a light-emitting device according to the invention explained in Embodiment is realized by using at least either the front glass 2102 or the rear window glass 2111 that is a window at a rear side. The front glass 2102 and the rear window glass 2111, each of which displays an image, correspond to the support 24 explained in Embodiment. Portions for displaying images in the front glass 2102 and the rear window glass 2111 are provided with the semi-transmissive film 23. A light-emitting device according to the invention can display an image without hindering vision since the front glass 2102 and the rear window glass 2111, each of which displays an image, have light-transmitting properties and a function of displaying images. Therefore, the vehicle has further high functionality and high added values.

A light-emitting device according to the invention does not hinder the view of a driver since the front glass 2102 and the rear window glass 2111, each of which displays an image, in a vehicle have light-transmitting properties. Accordingly, images of clock or speed meter can be displayed on the front glass 2102 as well as the display portion A 2101. The contents for displaying may be preferably operated, and display or nondisplay may be preferably switched by a driver with operation buttons as appropriate.

As shown in FIGS. 3A to 3C, the sensors 2104a and 2104b, and the cameras 2103a to 2103d may be provided, and information obtained from them may be displayed on the front glass 2102 and the rear glass window 2111 in the vehicle. Information detected by a detector for detecting external information of these vehicles may be displayed on the front glass 2102 and the rear window glass 2111 in a vehicle. Additionally, the detected external information may be made a sound by an internal speaker mounted on the vehicle for warning the driver or people around the vehicle that there is danger. Accordingly, a CPU 2109 is preferably provided to the internal of a vehicle. All necessary components may be connected to the CPU 2109.

In case that the sensor 2104a or the sensor 2104b detects an obstacle, the information on the obstacle is provided to the CPU 2109, and the warning of the obstacle is given by the display portions A 2101 and B 2108. Consequently, safer driving can be ensured. In addition, the camera 2103a to 2103d may take an image of external obstacles or the state of a vehicle to inform danger to a driver or people around the vehicle by the display portion A 2101 or the display portion B 2108. As noted above, a vehicle provided with a light-emitting device according to the invention has high added values by which a driver can drive safely and comfortably for him or her and people around the vehicle.

Figure 4A:
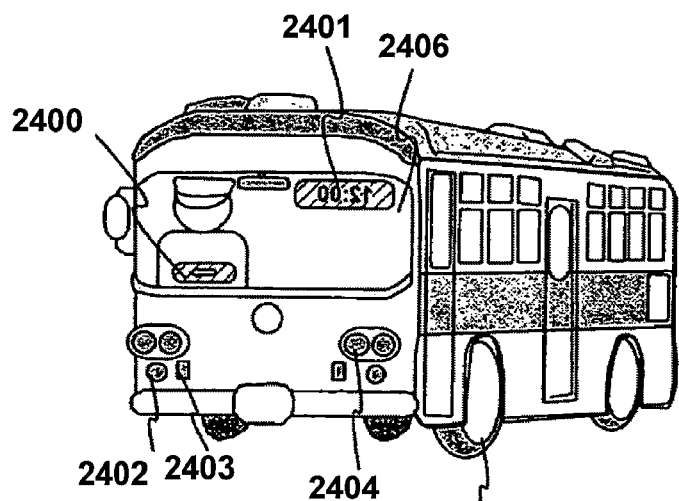
FIGS. 4A to 4C are views for showing Example 1 according to the invention.
Figure 4B:
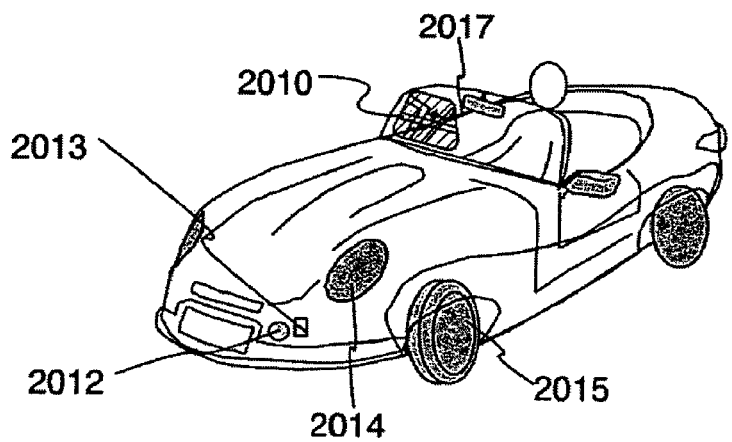
Figure 4C:
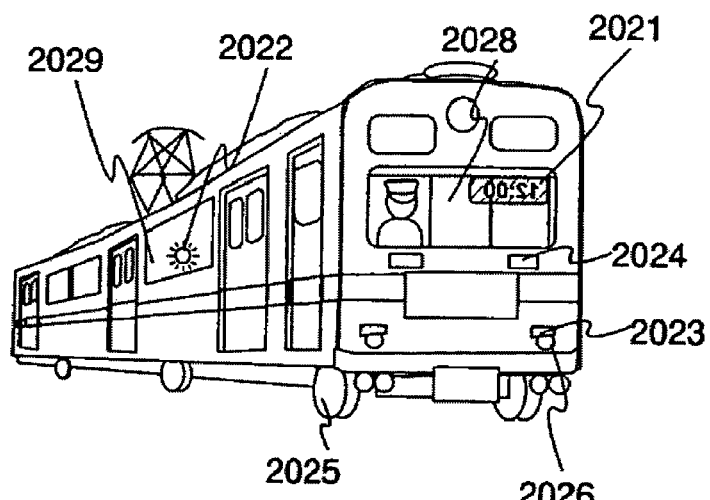

As examples of vehicles manufactured by practicing the invention, in addition to a car illustrated in FIGS. 3A to 3C, an automobile such as a sports car, a track, a bus, a station wagon, a vehicle for special use (ex., an ambulance), a vehicle for special purpose (ex., a tractor), or a specially-equipped vehicle (ex., a tanker), a train, a motor cycle, and the like can be nominated. FIGS. 4A to 4C shows the examples of the foregoing vehicles.

FIG. 4A shows a bus comprising a camera 2402, a sensor 2403, a light 2404, a wheel 2405, and a front glass 2406, and the like. The front glass 2406 serves as the semi-transmissive film 23 and the support 24 illustrated in FIG. 1. A display portion A 2400 and a display portion B 2401 can display information from, for example, a car navigation system.

FIG. 4B shows a sports car comprising a camera 2012, a sensor 2013, a light 2014, and a wheel 2015. A front glass 2017 serves as the semi-transmissive film 23 and the support 24 illustrated in FIG. 1. A display portion A 2010 can display information from, for example, a car navigation system.

FIG. 4C shows a train comprising a camera 2024, a sensor 2023, a light 2026, and a wheel 2025. A front glass 2028 and a window glass 2029 of a vehicle for carrying a passenger and the like serve as the semi-transmissive film 23 and the support 24 illustrated in FIG. 1. A display portion A 2021 and a display portion B 2022 can display, for example, information from a centralized control room or an image for entertaining passengers.

As noted above, since a display portion in a light-emitting device according to the invention has light-transmitting properties and a function of displaying an image, the outside can be viewed in case that a display portion is provided to a front glass or a window glass of a side face of a vehicle. Therefore, people in the vehicle and the like can obtain further more information.

It is beneficial that the present invention is practiced so that a display portion is provided to a front glass as this example to be used as a car navigation system. The car navigation system is a device by which information on the actual location and the direction of movement of the moving vehicle is measured by utilizing satellites, a geomagnetometer, a trochometer, and the like, and the information is displayed on the screen in the vehicle to inform a driver. Accordingly, a driver utilizes a car navigation system mostly during driving. However, most screens in the conventional car navigation system are arranged below a front glass, and so there is danger that a driver takes his eyes from a forward direction. According to the invention, a driver can obtain information from the screen of a car navigation system while seeing people in a forward direction or a road condition. Therefore, safe, convenient, and comfortable driving can be ensured.

In a display device explained in this example, it is also possible that an erect image directly obtained from the light-emitting device 21 is used in the dark, and a reverse image obtained from the light-emitting device 21 can be switched into an erect image in the light. Accordingly, it can be prevented from making it hard to adjust eye to the outside due to the image displayed on a front glass 23 in the dark such as night, and so visibility for an external image of a vehicle is improved.

A light-emitting device according to the invention can be freely provided to any part of a vehicle such as a window glass at side faces, a window glass at a roof referred to as a sun roof, and the like, besides a front glass and a rear window glass.

Example 2

An example of a structure in which a reverse image from a light-emitting device 21 is projected on a semi-transmissive film 23 via one optical device 22 is explained in Example 1. Alternatively, a structure in which a plurality of optical devices such as mirrors is sandwiched between the light-emitting device and the semi-transmissive film can be adopted. The structure is explained hereinafter with reference to FIGS. 7A and 7B.

Figure 7A:
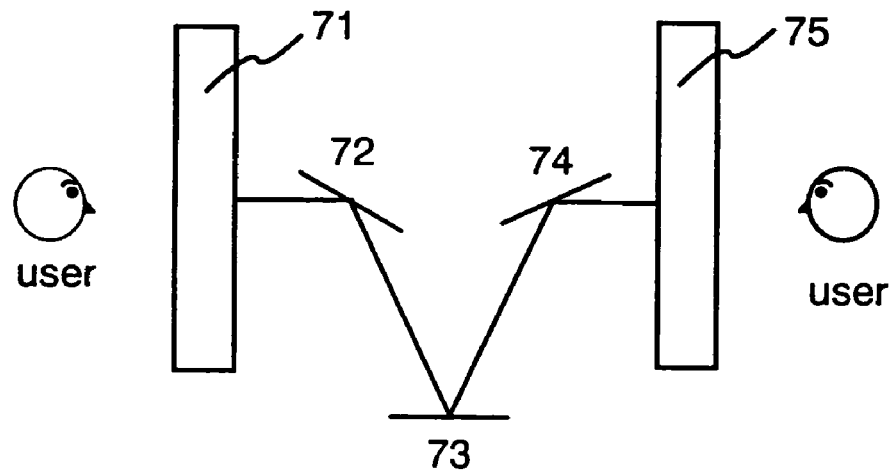
FIGS. 7A and 7B are views for showing Example 2 according to the invention.

FIG. 7A shows a structure in which three mirrors 72, 73, and 74 are sandwiched between a light-emitting device 71 and a semi-transmissive film 75. The number of mirrors is not limited to three as long as it is an odd number. Since an image obtained from one side of the light-emitting device 71 (left side in FIG. 7A) is an erect image, and an image obtained from another side (right side in FIG. 7A) is a symmetrical reverse image, people at one side (left side in FIG. 7A) can directly see the erect image from the light-emitting device 71. An image from another side (right side in FIG. 7A) is a reverse image. The reverse image can be converted into an erect image by reflecting by the mirror 72. Thereafter, the erect image becomes a reverse image again by the mirror 73, and becomes an erect image again by the mirror 74. The erect image is reflected on the semi-transmissive film 75. Therefore, people at another side (right side in FIG. 7A) can see the erect image.

A mirror for reducing an image is used as the mirror 72, and a mirror for enlarging an image is used as the mirror 74. Accordingly, a required optical system can be small. Further, another device for scaling (lens or the like) can be used instead of a mirror for reflection.

FIG. 7A shows the structure in which the semi-transmissive film 75 is arranged to be in parallel with the light-emitting device 71; but not exclusively. The semi-transmissive film 75 can be provided anywhere as long as an image is reflected on the film by changing the position of mirrors and so on.

Figure 7B:
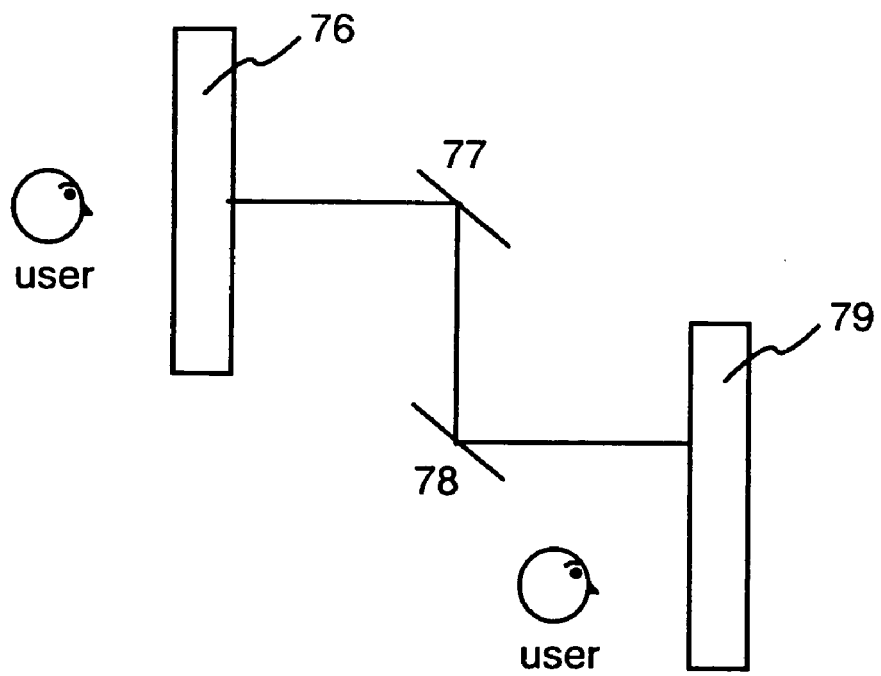

FIG. 7B shows a structure in which two mirrors 77 and 78 are sandwiched between a light-emitting device 76 and a semi-transmissive film 79. The number of mirrors is not limited to two as long as it is an even number. Since an image obtained from one side of the light-emitting device 76 (left side in FIG. 7B) is an erect image, and an image of another side (right side in FIG. 7B) is a symmetrical reverse image, people at one side (left side in FIG. 7B) can directly see the erect image from the light-emitting device 76. An image obtained from another side (right side in FIG. 7B) is a reverse image. The reverse image can be converted into an erect image by reflecting by the mirror 77. Thereafter, the erect image becomes a reverse image again by the mirror 78, and the reverse image is reflected on the semi-transmissive film 79. Therefore, people at one side (left side in FIG. 7B) see the image as an erect image.

Mirrors, lens, or the like can be used to scale an image, and a semi-transmissive film can be positioned anywhere. In this regard, it is the same as in the case with that as mentioned above. Alternatively, a reflective film (mirror) can be used instead of the semi-transmissive film 79.

Example 3

An EL layer in an EL element is generally formed to be a thin film to make it easier for current to apply through the EL layer. In order to obtain uniform light emission, it is important to deposit the EL layer to have smoothness. In case that an EL layer is formed by vapor deposition over a film without smoothness, a deposited film of an EL layer cannot cover irregularities, and pinholes are often produced. In this state, an anode and a cathode are susceptible to be short-circuited, and it causes point defects in a display device.

An ITO film deposited by sputtering generally used as a transparent electrode is difficult to be deposited to have smoothness, since the ITO film is susceptible to be a poly crystal and produces protrusions due to the crystal grain growth. In case of using such the ITO film, a deposited film of an EL layer is required to be thick to cover protrusions, and it causes the increase of a drive voltage. Further, when the EL layer becomes thick, the transmittance is reduced since the most materials for the EL layer have poor light-transmitting properties.

There is a method for polishing the ITO film in order to improve the smoothness of the ITO film having irregularities; however, the problem is arisen that the manufacturing cost is increased, and throughput is decreased due to the increase of the number of the manufacturing process.

In this example, a method for thinning the thickness to increase the transparency of a light-emitting layer by using an anode having well smoothness is explained. Therefore, a light-emitting element in which an anode of an EL element is conductive polymer is explained.

As the foregoing conductive polymer, a material containing a dopant material or a conductive filler for improving conductivity can be used. In addition, the conductive polymer can contain both the dopant and the conductive filler. In the structure disclosed in this example, an ITO film having poor smoothness is not used as an anode, and conductive polymer having well smoothness is used as an anode. As a result, a light-emitting device with high transparency can be formed since an EL layer can be formed to have a thin thickness. A wiring for transmitting an electrical signal to an anode formed by the foregoing conductive polymer is formed on the anode. The wiring is preferably formed by a material with a high work function. Accordingly, the injection of holes to the conductive polymer is carried out smoothly, and the increase of the onset voltage for detectable electroluminescence can be suppressed for the decrease of an energy barrier.

Figure 5A:
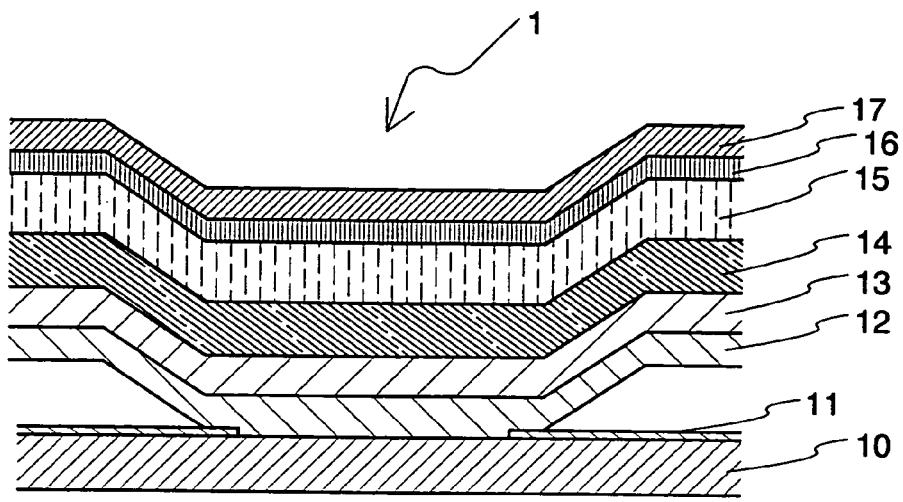
FIGS. 5A to 5C are views for showing Example 3 according to the invention.

FIG. 5A is a cross-sectional view of the structure of a light-emitting element according to the invention. A light-emitting device 1 shown in FIG. 5A is formed to have a structure in which a wiring 11, a conductive polymer layer 12 serving as an anode, a hole transporting layer 13, a light-emitting layer 14, an electron transporting layer 15, an electron injecting layer 16, a cathode 17 are sequentially deposited over a substrate 10. Light is emitted out of the substrate 10 and the cathode 17. In the structure, the electron injecting layer and the electron transporting layer can be formed as one layer such as an electron injecting transporting layer. Further, the hole transporting layer or the electron transporting layer may serve as a light-emitting layer. As materials for forming these layers, organic compounds, inorganic compounds, or organic or inorganic mixture can be used. In addition, as used herein, the term "EL layers" is a generic term used to refer to layers (the hole transporting layer 13, the light-emitting layer 14, the electron transporting layer 15, the electron injecting layer 16) interposed between the conductive polymer 12 and the cathode 17.

Light emission generated in a light-emitting element can be emitted out of an anode or a cathode, or both an anode and a cathode. Hereinafter, the case that light emission is emitted out of both an anode and a cathode is explained.

The substrate 10 is formed by a transparent or a semi-transmissive material such as glass, resin, or the like in order to emit light out of a substrate side.

As the wiring 11 connected to the conductive polymer layer 12 serving as an anode, a material having low resistance is preferably used, for example, aluminum (Al) or an aluminum alloy is preferably used. In consideration with that the conductive polymer layer 12 serving as an anode is formed on the wiring 11, the hole injection properties of the wiring 11 for the conductive polymer layer 12 serving as an anode may be improved by forming the wiring 11 by metals, alloys, conductive compounds, or mixture of the foregoing materials, each of which has a work function of at least approximately 4 eV, preferably, from approximately 4 to 7 eV. As specific examples of a material for the wiring 11, aurum, silver, copper, platinum, palladium, tungsten, nickel, or the like can be used.

The conductive polymer layer 12 is formed by a material with a high work function and transparency since the conductive polymer layer 12 serves as both an anode and a hole injecting layer in the invention. For example, a material containing mainly polyethylene dioxythiophene (PEDOT), polystyrene sulfonic acid (PSS), polythiophene (PT), polyacetylene, or a material including the foregoing substances as a basic skeleton can be used.

Figure 5B:
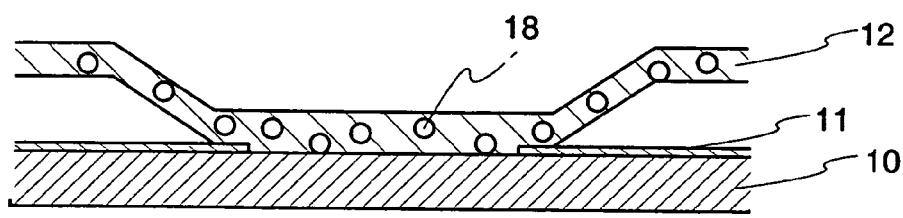
Figure 5C:
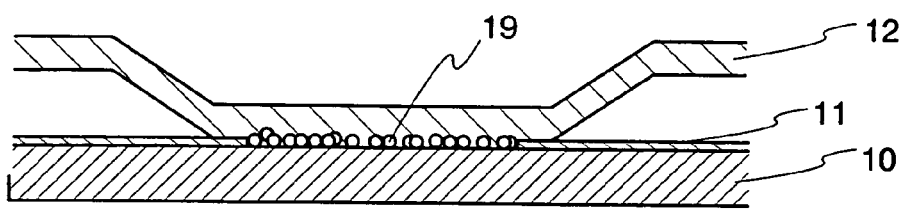

In the case that the conductive polymer layer 12 is formed by a material containing mainly polyethylene dioxythiophene (PEDOT), polystyrene sulfonic acid (PSS), polythiophene (PT), and polyacetylene, a dopant 18 may be added to improve electrical conductivity as shown in FIG. 5B. As the dopant, $F_4$-TCNQ, $FeCl_3$, $C_{60}$, iodine (I), and the like can be nominated. Besides the dopant, a conductive filler 19 may be contained as shown in FIG. 5C. As the conductive filler 19, nanoparticles such as aurum, silver, platinum, palladium, nickel, carbon black, or carbon nanotubes is preferably used. The segregation of these materials is observed at below of the conductive polymer layer 12. It seems like that the conductive polymer layer 12 is separated into two layers, that is, a conductive filler layer and a conductive polymer layer. Therefore, light becomes easy to be emitted since holes from the wiring 11 are injected to the conductive polymer layer passing through the conductive filler layer.

As a material having excellent hole transportation properties for the hole transporting layer 13, aromatic trimethyl amine, a hydrazone derivative, a carbazole derivative, a triazole derivative, an imidazole derivative, an oxadiazole derivative with an amino group, polythiophene, or the like can be used.

The light-emitting layer 14 may be composed of two kinds of materials, a host material and a dopant material. As a host material for the light-emitting layer 14, a quinolinonato metal complex is preferably used. As specific examples, tris-8-quinolinonato aluminum complex ($Alq_3$), tris-8-quinolinonato gallium complex, bis-8-quinolinonato magnesium complex, bis-8-quinolinonato zinc complex, tris-(5-methyl)-8-quinolinonato aluminum complex, tris-(7-propyl)-8-quinolinonato complex, bis[benz{f}-8-quinolinonato] aluminum complex, or the like can be used, but not exclusively.

As the electron transporting layer 15, 8-quinolinol such as $Alq_3$, or an organic metal complex including the derivative as ligands such as a quinoline derivative, an oxadiazole derivative, a perylene derivative, a pyridine derivative, a quinoxaline derivative, a diphenyl quinone derivative, an nitro substituted fluorene derivative, or the like. The electron transporting layer may serve as a light-emitting layer. In case that $Alq_3$ is used for forming the light-emitting layer, $Alq_3$ is preferably used for the electron transporting layer.

As the electron injecting layer 16, a material that improves electron injection efficiency and has excellent transparency is preferably used. Only the material may be deposited, but a material doped with an alkali metal may be more preferably used since electron injection efficiency becomes increased.

The cathode 17 is formed by a thin film of a material having a small work function such as Li, Na, Mg, Al, Ag, or In, or an alloy containing at least one of the foregoing materials, preferably, a transparent conductive film or the like such as indium tin oxide (ITO), indium oxide, or zinc oxide. Alternatively, a film formed by a transparent or semi-transmissive material added with Li, Cs, or the like can be used.

Though not shown, a protective film may be formed over the cathode 17. The protective film is formed by SiN, SiON, a multi-layer including organic materials and inorganic materials, or the like to have a thickness that does not deteriorate extremely the light transmittance. These films can prevent moisture from penetrating into the EL layer to improve the reliability.

A method for manufacturing a light-emitting element according to this example is explained.

The conductive polymer layer 12 is formed by coating such as spin coating or ink-jet. The dopant 18 or the filler 19 may be dispersed in the conductive polymer layer 12. The hole transporting layer 13, the light-emitting layer 14, the electron transporting layer 15, and an electron injecting layer 16 are preferably formed by vacuum vapor deposition since uniform thin films can be formed by the vacuum vapor deposition. These films are preferably formed at a deposition rate of from 0.01 to 1 nm/sec. In case that the deposition rate is too fast, a problem may be arisen that the onset voltage is increased, the injection efficiency of charges is deteriorated, or the like.

In the case that these layers are formed by vacuum vapor deposition, each boat filled with organic compounds is preferably individually controlled its temperature to carry out co-evaporation in order to form one layer by a plurality of organic compounds. When the plurality of organic compounds has the same or almost the same vapor pressure each other, the organic compounds can be preliminarily mixed in one boat to be deposited. Besides the vacuum vapor deposition, coating (spin coating, dipping, casting, or the like), Langmuir-Blodgett (LB), or the like can be utilized.

In a light-emitting element according to this example, an anode is formed by a conductive polymer film instead of an ITO film as a transparent electrode. Accordingly, the light-emitting element has excellent smoothness, and a light-emitting layer can be formed to be thin. Therefore, a dual emission device having high transparency can be manufactured. The dual emission device has an advantage that short-circuits due to pin-holes between electrodes, point defects, or dark spots are reduced.

Figure 6:
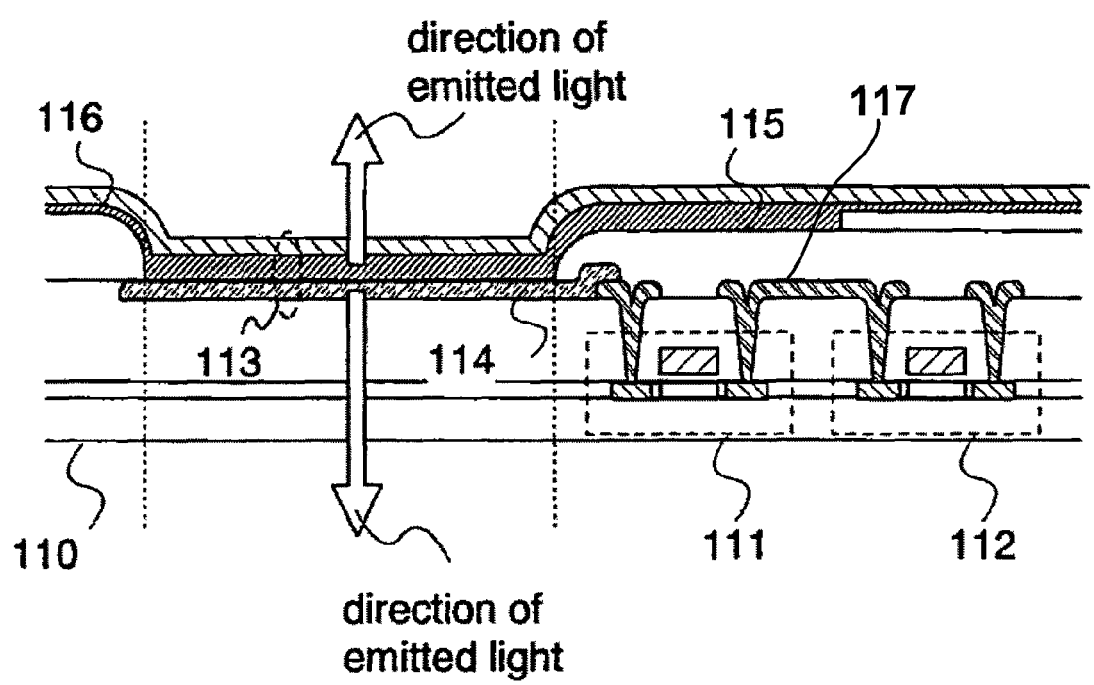
FIG. 6 is an explanatory view for a light-emitting device capable of utilizing the invention.

A passive type light-emitting device in which a light-emitting element is formed on a support substrate such as a glass substrate or the like can be manufactured by using the foregoing light-emitting element according to this example. Besides, an active matrix type light-emitting device may be manufactured in which a light-emitting element is formed over a TFT (Thin Film Transistor) array substrate, and the drive of the light-emitting element is controlled by transistors or the like provided over the TFT array substrate can be manufactured. In FIG. 6, reference numeral 110 denotes a substrate; 111, 112, TFTs; 113, an EL element including an anode 114, an EL layer 115, and a cathode 116; and 117, a wiring.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A semiconductor device comprising;
    a light-emitting device emitting light out of both an anode and a cathode;
    an optical device configured to vary a size of an image displayed by the light-emitting device; and
    a film formed over a support dissociated from the light-emitting device,
    wherein the light emitting out one of the anode and the cathode is captured by the optical device and entered into the film, and
    wherein the optical device is in contact with the light-emitting device.

2. The semiconductor device according to claim 1, wherein an image produced by reflecting the light entered into the film is an erect image.

3. The semiconductor device according to claim 1, wherein the film is a semi-transmissive film.

4. A device comprising;
    a light-emitting device emitting light out of both an anode and a cathode;
    a mirror, and
    an optical device configured to vary a size of an image displayed by the light-emitting device,
    wherein the light emitting out one of the anode and the cathode is captured by the optical device and entered into the mirror, and
    wherein the optical device is in contact with the light-emitting device.

5. The semiconductor device according to claim 4, wherein an image produced by reflecting the light entered into the mirror is an erect image.

6. A semiconductor device comprising;
    a light-emitting device emitting light out of both an anode and a cathode;
    an optical device configured to vary a size of an image displayed by the light-emitting device,
    a semi-transmissive film formed over a support dissociated from the light-emitting device; and
    a mirror between the light-emitting device and the support,
    wherein the light emitting out one of the anode and the cathode is captured by the optical device and entered into the semi-transmissive film via reflecting by the mirror, and
    wherein the optical device is in contact with the light-emitting device.

7. The semiconductor device according to claim 6, wherein an image produced by the light entered into the semi-transmissive film is an erect image.

8. The semiconductor device according to claim 6, wherein the semiconductor device further comprises a device for scaling an image produced by the light emitting out one of the anode and the cathode.

9. A semiconductor device comprising;
    a light-emitting device emitting light out of both an anode and a cathode;
    an optical device configured to vary a size of an image displayed by the light-emitting device,
    a semi-transmissive film formed over a support dissociated from the light-emitting device; and
    two mirrors between the light-emitting device and the support,
    wherein the light emitting out one of the anode and the cathode is captured by the optical device and entered into the semi-transmissive film via reflecting by the two mirrors, and
    wherein the optical device is in contact with the light-emitting device.

10. The semiconductor device according to claim 9, wherein an image produced by reflecting the light entered into the semi-transmissive film is an erect image.

11. The semiconductor device according to claim 9, wherein the semiconductor device further comprises a device for scaling an image produced by the light emitting out one of the anode and the cathode.

12. A semiconductor device comprising;
    a light-emitting device emitting light out of both an anode and a cathode; and
    an optical device configured to vary a size of an image displayed by the light-emitting device,
    wherein the anode is made of a conductive polymer that comprises dopant material and conductive filler, and
    wherein light emitted through the anode enters the optical device, and wherein the optical device is in contact with the light-emitting device.

13. A vehicle comprising;

a light-emitting device emitting light out of both an anode and a cathode;

a front glass with a semi-transmissive film, and an optical device configured to vary a size of an image displayed by the light-emitting device, wherein the light emitting out one of the anode and the cathode is captured by the optical device and entered into the semi-transmissive film, and wherein the optical device is in contact with the light-emitting device.

* * * * *